United States Patent
Mohammadi et al.

(10) Patent No.: US 11,901,006 B2
(45) Date of Patent: Feb. 13, 2024

(54) SHIFTABLE MEMORY AND METHOD OF OPERATING A SHIFTABLE MEMORY

(71) Applicant: XENERGIC AB, Lund (SE)

(72) Inventors: Babak Mohammadi, Lund (SE); Hemanth Prabhu, Lund (SE); Reza Meraji, Malmö (SE)

(73) Assignee: XENERGIC AB

( * ) Notice: Subject to any disclaimer, the term of this patent is extended or adjusted under 35 U.S.C. 154(b) by 169 days.

(21) Appl. No.: 17/611,364

(22) PCT Filed: May 14, 2020

(86) PCT No.: PCT/EP2020/063513
§ 371 (c)(1),
(2) Date: Nov. 15, 2021

(87) PCT Pub. No.: WO2020/229620
PCT Pub. Date: Nov. 19, 2020

(65) Prior Publication Data
US 2022/0215881 A1 Jul. 7, 2022

(30) Foreign Application Priority Data

May 16, 2019 (EP) ..................................... 19174890

(51) Int. Cl.
*G11C 15/04* (2006.01)

(52) U.S. Cl.
CPC .................................... *G11C 15/04* (2013.01)

(58) Field of Classification Search
CPC ....... G11C 15/04; G11C 11/41; G11C 11/401; G11C 11/4023; G11C 11/4045;
(Continued)

(56) References Cited

U.S. PATENT DOCUMENTS

| 3,716,723 A | 2/1973 | Heuner et al. |
| 3,760,368 A | 9/1973 | Dailey et al. |

(Continued)

FOREIGN PATENT DOCUMENTS

| JP | 52095938 A | 8/1977 |
| WO | 2013062596 A1 | 5/2013 |

OTHER PUBLICATIONS

RAM-Based Shift Register (ALTSHIFT_TAPS) IP Core User Guide.
(Continued)

*Primary Examiner* — Alfredo Bermudez Lozada
(74) *Attorney, Agent, or Firm* — DINSMORE & SHOHL LLP

(57) ABSTRACT

The present disclosure relates to a shiftable memory comprising: a plurality of memory cells arranged in rows and columns, wherein the memory cells of the rows are interconnected, thereby forming chains of memory cells; at least one first serial output data port; output data logic for connecting an output of any of the chains of memory cells to the first serial output data port, or at least one first parallel output data port and at least one read shift register configured for serially collecting serial output data from the output of any of the chains of memory cells; and/or at least one first serial input data port; input data logic for connecting the first serial input data port to an input of any of the chains of memory cells, or at least one parallel input data port and at least one write shift register for serially shifting input data to the input of any of the chains of memory cells; and a controller configured to control the shifting of the data in the chains of memory cells, the controller further configured to control the output data logic and/or the input data logic. The disclosure further relates to a method for operating the shiftable memory.

19 Claims, 11 Drawing Sheets

(58) Field of Classification Search
CPC ... G11C 11/412; G11C 19/188; G11C 19/287; G11C 19/18; G11C 19/28; G11C 19/00; G11C 19/182; G11C 19/184; G11C 19/186
See application file for complete search history.

(56) References Cited

U.S. PATENT DOCUMENTS

| | | | |
|---|---|---|---|
| 5,276,643 | A | 1/1994 | Hoffmann et al. |
| 8,189,408 | B2 * | 5/2012 | Gupta .................... G11C 19/00 365/189.12 |
| 9,390,773 | B2 | 7/2016 | Kelly et al. |
| 9,606,746 | B2 | 3/2017 | Graefe et al. |
| 9,741,399 | B2 | 8/2017 | Tiwari |
| 2014/0247673 | A1 | 9/2014 | Muralimanohar et al. |
| 2014/0344544 | A1 | 11/2014 | Nakamura et al. |
| 2016/0266873 | A1 | 9/2016 | Tiwari et al. |
| 2019/0043560 | A1 | 2/2019 | Sumbul et al. |

OTHER PUBLICATIONS

Nakamura, T. et al., "Marching memory: designing computers to avoid the memory bottleneck", Proceedings of the sixth internation Workshop on Unique Chips and Systems, Atlanta, GA, US, Dec. 4, 2010, pp. 44-47.

* cited by examiner

SHIFTABLE MEMORY AND METHOD OF OPERATING A SHIFTABLE MEMORY

CROSS-REFERENCE TO RELATED APPLICATIONS

This application is the U.S. National Stage of PCT/EP2020/063513 filed May 14, 2020, which claims priority to European Patent Application No. 19174890.4, filed May 16, 2019, the content of both are incorporated herein by reference in their entirety.

FIELD OF THE INVENTION

The present disclosure relates to a shiftable memory, such as a static random access memory or a dynamic random access memory, and to a method of operating a shiftable memory.

BACKGROUND OF INVENTION

In many modern advanced System on Chip (SoC) designs there is a need for large memory subsystems (MSS) for various requirements. Many applications require large memories in terms of number of storage elements. For example, a computer usually includes a central processing unit (CPU) for providing arithmetic and logical operations and other operations, and typically a number of CPU operations involve reading from or writing data to memory.

There are two types of RAM: static random access memory (SRAM) and dynamic random access memory (DRAM). The main memory in a computer is typically DRAM.

Static random access memories are widely used in integrated circuits and may account for a significant portion of the area and power consumption of the circuit. SRAM is faster and more expensive than DRAM and may be used for, for example, in CPU cache. SRAM is typically used in cases where speed is more important than cost and area. A typical memory cell of an SRAM memory is a six-transistor (6T) memory cell made up of six MOSFETs. Each bit is stored on four transistors that form two cross-coupled inverters. In addition to the four transistors, the two cross-coupled inverters are connected to a bit line and an inverted bit line through two further access transistors, which are controlled by a common word line in the standard single-port 6T SRAM cell.

DRAM stores each bit in a small capacitor, which can either be charged or discharged. An advantage of DRAM is the small size and simplicity of the memory cells. DRAM must, however, be periodically refreshed, which is a disadvantage in terms of complexity timing and power consumption. DRAM is widely used in digital electronics where low-cost and high-capacity memory is required.

The memory cells of memories are accessed by bit lines, typically arranged in the direction of the columns of the memory cell array connected to the storage nodes through transistors. The accesses are controlled by word lines, typically arranged in the direction of the rows of the memory cell arrays. The control of the individual bit lines and word lines are typically based on instructions or addresses on the memory ports. In case of dual-port (or multi-port) RAM, which is a type of memory that allows multiple reads or writes at the same time, additional bit lines and additional logic have to be added to the memory, which is typically expensive in terms of area and power.

Attempts have been made to introduce shifting functionality in the memories for various purposes. This kind of shifting functionality typically involves multiplexers and/or additional logic and often has the purpose of re-arranging data, manipulating data in, for example, data matrices, vector re-positioning or data processing related tasks. The shifting functionality typically adds functionality to the memory, but also adds complexity and size.

SUMMARY OF INVENTION

A first aspect of the present disclosure relates to a shiftable memory with the purpose of reducing complexity, thereby area and power cost or overhead. In particular, in one embodiment, the presently disclosed shiftable memory may be implemented completely without internal bit lines, which may significantly reduce the power consumption. The shiftable memory may, in a preferred embodiment, comprise:

- a plurality of memory cells arranged in rows and columns, wherein the memory cells of the rows are interconnected, thereby forming chains of memory cells;
- at least one first serial output data port; output data logic for connecting an output of any of the chains of memory cells to the first serial output data port, or at least one first parallel output data port and at least one read shift register configured for serially collecting serial output data from the output of any of the chains of memory cells; and/or
- at least one first serial input data port; input data logic for connecting the first serial input data port to an input of any of the chains of memory cells, or at least one parallel input data port and at least one write shift register for serially shifting input data to the input of any of the chains of memory cells; and
- a controller configured to control the shifting of the data in the chains of memory cells, the controller further configured to control the output data logic and/or the input data logic.

According to one embodiment, the shiftable memory can therefore operate without the need for internal bit lines. In a read access, the controller is configured to shift data of a row until the data has been read sequentially, either to a serial output data port or to a read shift register, which can then be accessed from a parallel output data port. In a write access, the controller is configured to connect a first serial input data port to an input of any of the chains of memory cells and shift data in sequentially, alternatively writing data from a parallel input data port to a write shift register and then serially shifting the data to the input of any of the chains of memory cells.

The inventors have found that the shiftable memory may, in particular, be highly efficient for dual- and multi-port memories. By shifting several rows in parallel, reading and writing from/to a number of configurable ports comes at a very low additional cost, which is in contrast to dual- and multiport capabilities of conventional memories. The output data logic may be configured for connecting an output of any of the chains of memory cells to a second serial output data port, or at least one second parallel output data port and at least one second read shift register configured for serially collecting serial output data from the output of any of the chains of memory cells. This can be done for several rows, such that n chains of memory cells can be shifted in parallel to n serial output data ports, or to n shift registers. In the same way, the input data logic may be configured for connecting a second serial input data port to an input of any of the chains of memory cells, or a second parallel input data port and a second write shift register for serially shifting input data to the input of any of the chains of memory cells. This can be done for several rows, such that m chains of memory cells can be shifted, wherein the controller is configured to shift in data from m serial input data ports to m chains of memory cells in parallel. Read and write can also be done simultaneously.

The interconnections of memory cells within rows can be implemented by means of switch elements. In order to maintain a simple and robust implementation, the memory cells may be separated by for example a transistor. Enable signals may control the shifting in the manner that a word line signal controls the access of a storage node by a bit line in a conventional memory cell. In order to avoid that values are shifted in the wrong direction of the chains and that values are accidently overridden, each memory cell of the present shiftable memory may comprise two serially connected memory elements, such as bit cells separated by a further switch element, such as a transistor. This means that each memory cell may have two memory elements and two switch elements. The shifting of the two serially connected memory elements may be controlled using two different control signals, wherein the two different control signals operate in two different phases. This could be for example a first clock signal and a second clock signal which is inverted or delayed in relation to the first clock.

Further use of the presently disclosed shiftable memory includes a refresh process for a dynamic random access memory. The inventors have realized that parallel shift of all rows or a sequence including shifting of all rows, shifting as little as only one step, will have the consequence that all memory cells are re-written and consequently refreshed.

The present disclosure further relates to a method for operating the shiftable memory. In a first embodiment, the method comprises the steps of:
- shifting data of at least one row of a shiftable memory having a plurality of memory cells arranged in rows and columns, wherein the memory cells of the rows are interconnected, thereby forming chains of memory cells;
- reading shifted data sequentially from a first serial output data port of the shiftable memory connected to an output of any of the chains of memory cells, or shifting data sequentially to an internal read shift register and reading data from the internal read shift register through a parallel output data port, or writing data sequentially to a first serial input port of the shiftable memory connected to an input of any of the chains of memory cells, or writing data from a parallel input data port to an internal write shift register and shifting data sequentially from the internal write shift register to an input of any of the chains of memory cells.

One embodiment relates to the further step of shifting each row at least one step. The inventors have realized that this may be an efficient way of performing a refresh operation of a dynamic random access memory. The refresh process may also be done seamlessly in parallel to the read/write operations of the memory. In case of DRAM, typically the refresh operations are blocking for memory accesses, i.e. parts or whole memory goes into a refresh state wherein normal read/write operations are blocked. The inventors have realized that refreshing of the memory can be done in parallel to read/write accesses. In one embodiment, the controller is therefore configured to perform the refresh operation and reading and/or writing data from/to the chains of memory cells concurrently. Furthermore, the refresh can be performed using a slower clock which may also be configured based on the retention time.

DETAILED DESCRIPTION OF THE INVENTION

Figure 1:
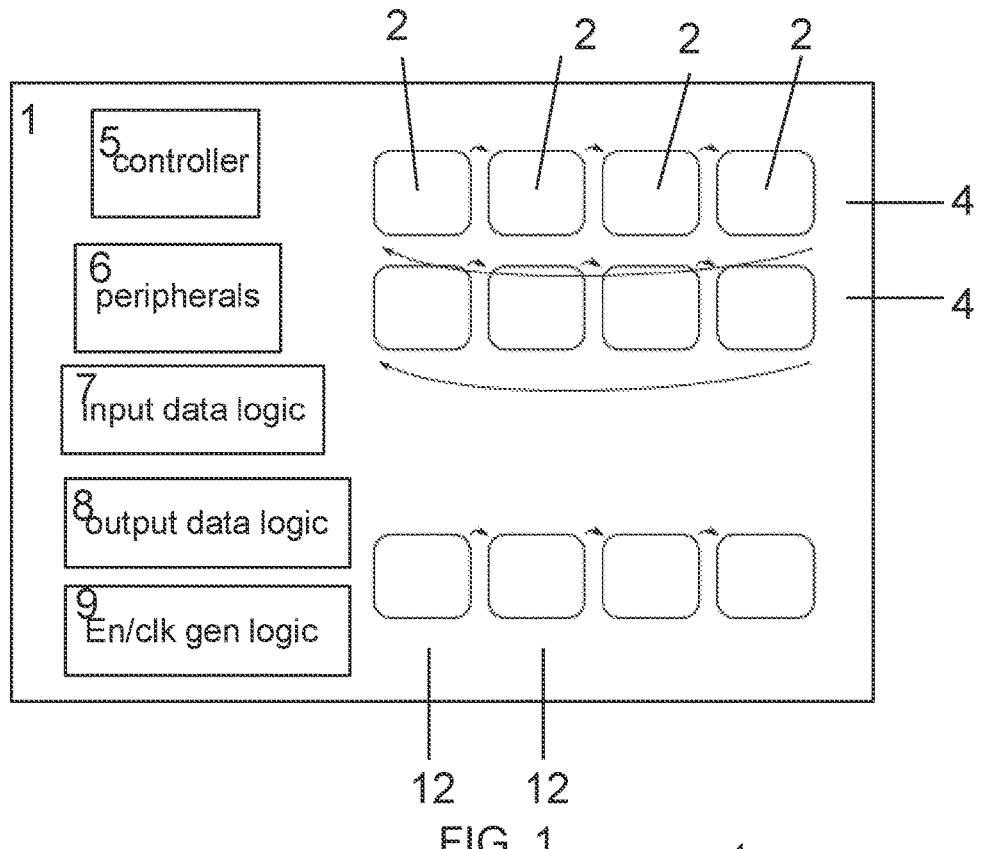
FIG. 1 is a conceptual top-level exemplary illustration of the presently disclosed shiftable memory.

The present disclosure relates to a shiftable memory comprising a plurality of memory cells arranged in rows and columns, wherein the memory cells of the rows are interconnected, thereby forming chains of memory cells. The shiftable memory may further comprise at least one first serial output data port and output data logic for connecting an output of any of the chains of memory cells to the first serial output data port. The output data logic could be implemented as a multiplexer, controlled by a controller, wherein the outputs of the chains of memory cells are connectable to the first serial output data port through the multiplexer. Alternatively, the shiftable memory may have at least one internal read shift register for serially collecting serial output data from the output of any of the chains of memory cells. When read data has been collected, data can be read by a first parallel output data port. Preferably, the shiftable memory further comprises at least one first serial input data port and input data logic for connecting the first serial input data port to an input of any of the chains of memory cells. The input data logic could be for example a switch on each input of the chains of memory cells, controlled by the controller. Alternatively, the data could be written to a write shift register from a parallel input data port and then serially shifted to the input of any of the chains of memory cells. The controller may be configured to control the shifting of the data in the chains of memory cells. The controller may be further configured to control the output data logic and the input data logic. The controller may comprise a decoder for decoding addresses and enable signals of the memory and transfer them into shift operations. As an example, a read operation of a specific address, provided by for example a read enable signal and a read address, may generate internal enable signals for shifting a specific row of the memory and routing the output of the chain to an output port, optionally through an internal read shift register. Preferably, during a read operation, the output of the last cell in the chain is routed back to the input of the first memory cell of the chain, unless there is a simultaneous write of the chain.

The shiftable memory may have word lines or other control lines for controlling the access of data to the memory cells.

The shiftable memory may also be a combination of a parallel and serial memory in the sense that a parallel read or write may still be performed using bit lines as a conventional memory. In this embodiment, the memory may for example include one port for a for conventional parallel read and another port for shifted serial read.

The presently disclosed shiftable memory may be implemented and operated without internal bit lines within the columns. This may reduce both the area and power consumption of the memory. Instead of connecting bit lines to the memory cells in the columns, the memory cells may be connected to each other using shift logic elements. The shift logic elements may be for example switches, which could be implemented as gate elements, for example in the form of a single transistor.

Two-Stage Memory Cells

Figure 7A:
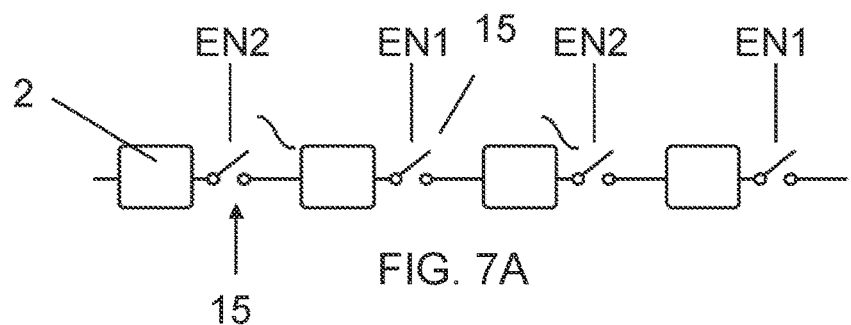
FIG. 7 illustrates embodiments of a chain of memory cells of a static random access memory.
Figure 7B:
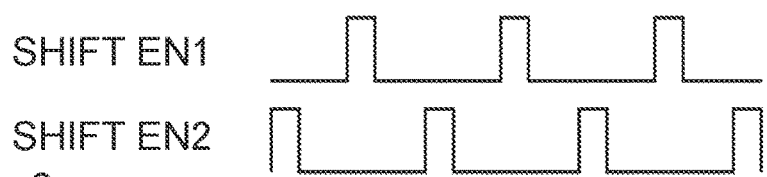
Figure 7C:
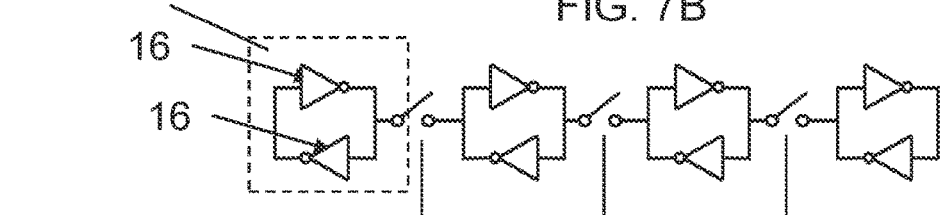
Figure 9A:
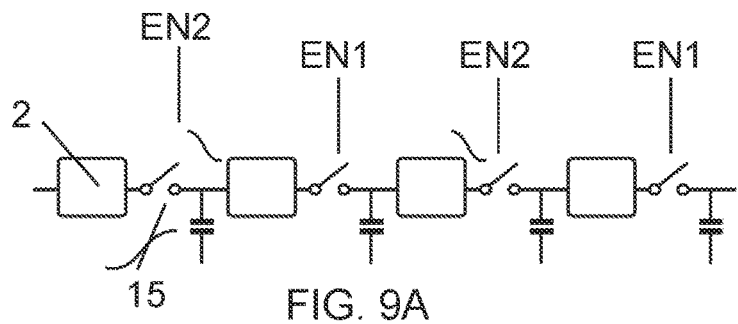
FIG. 9 illustrates embodiments of a chain of memory cells of a dynamic random access memory.
Figure 9B:
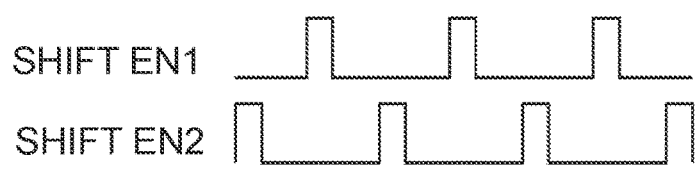
Figure 9C:
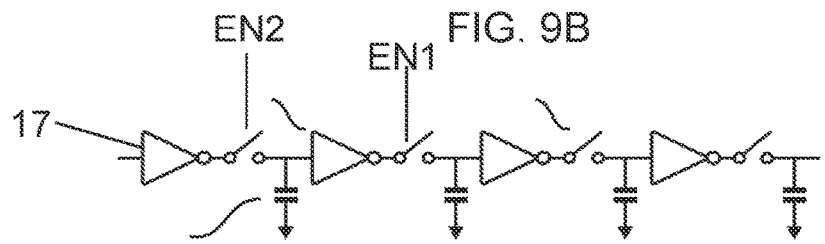
Figure 9D:
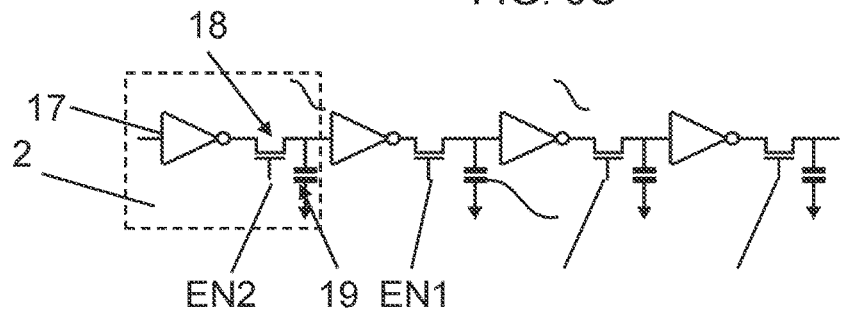

As stated, the memory cells may be separated by for example a switch in the form of a transistor between each cell. Enable signals may control the shifting of the chains by closing the switches. Each memory cell of the present shiftable memory may comprise two serially connected memory cells, such as bit cells, separated by a further switch element, such as a transistor. An example can be seen in FIG. 7D. Each memory cell (2) is implemented as two serially connected memory elements (3). The data is shifted in two steps, wherein a first enable signal (EN1, FIG. 7D, SHIFT EN1, FIG. 7B) controls the shifting of the first memory element and a second enable signal (EN2, FIG. 7D, SHIFT EN2, FIG. 7B) controls the shifting of the second memory element. Each memory cell may thereby comprise two memory elements and two switch elements. The shifting of the two serially connected memory elements may be controlled using two different control signals, wherein the two different control signals operate in two different phases. This could be for example a first clock signal and a second clock signal which is inverted or delayed in relation to the first clock, as illustrated in FIG. 7B and FIG. 9B. The control signals (clock signals and/or enable signals) may be for example inverted or skewed in relation to each other. The control signals may accordingly control the shift logic elements.

Operations

Figure 3A:
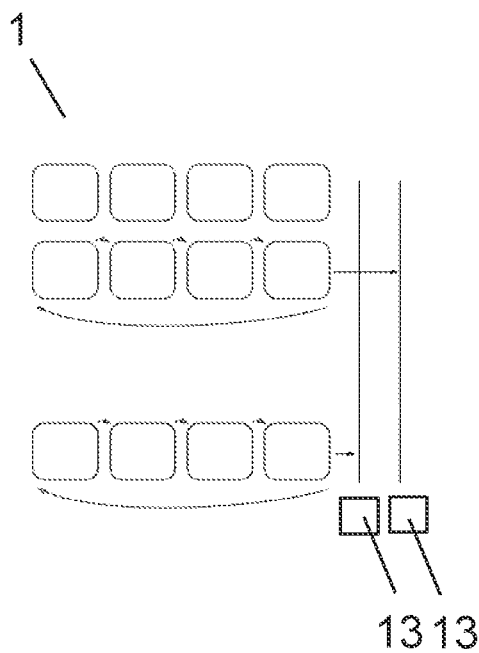
FIG. 3 shows examples of shift and read operations of the presently disclosed shiftable memory for two read ports.
Figure 3B:
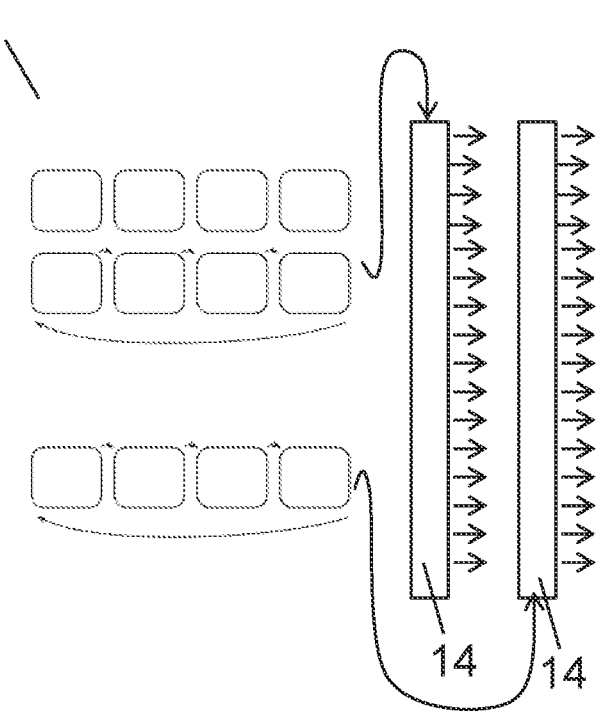
Figure 4:
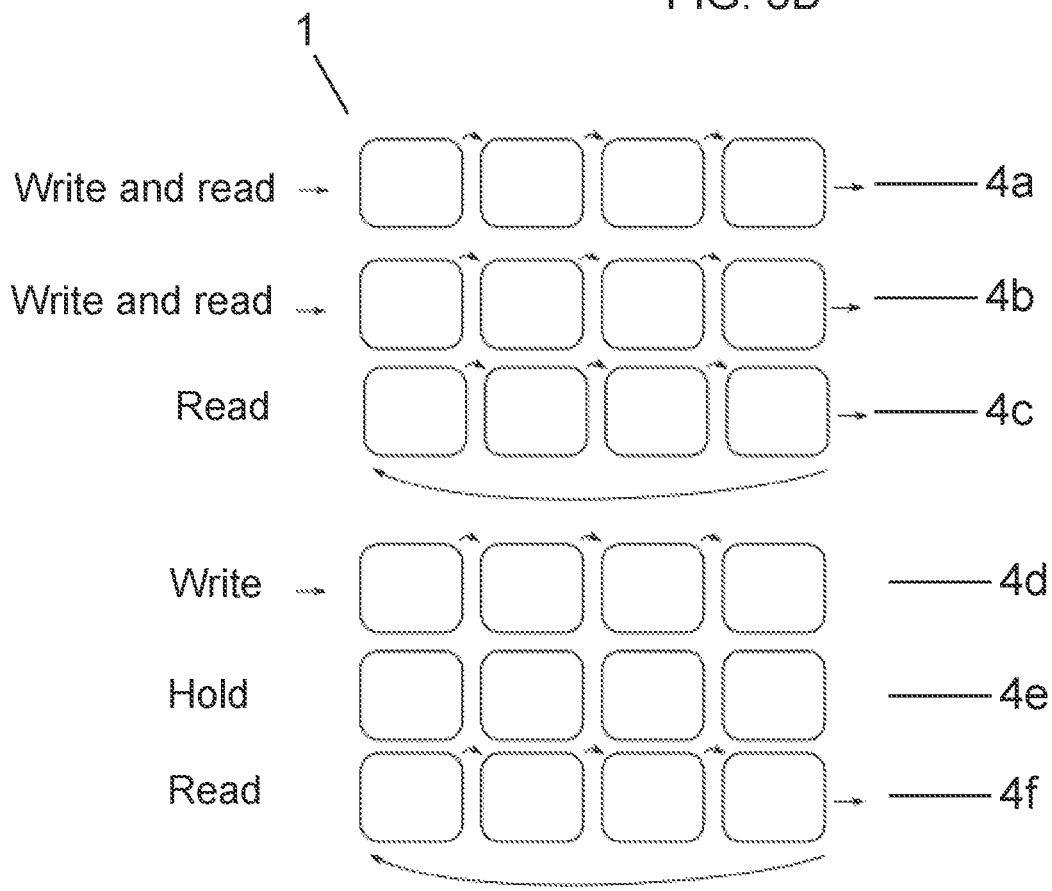
FIG. 4 shows an example of multiple parallel shifting operations.
Figure 5:
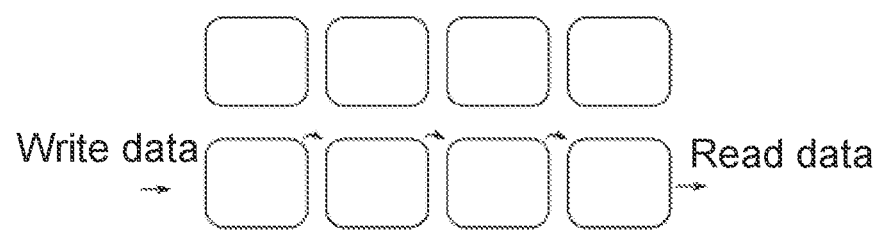
FIG. 5 shows an example of simultaneous read and write of data in the same row.

One advantage of the presently disclosed shiftable memory is that by shifting several rows in parallel and adding any desired number of input and/or output and/or bidirectional ports, dual- and multi-port memories can be obtained with a relatively low additional cost. In a conventional memory, implementation of true dual-port functionality is costly due to, for example, the need for additional transistors and complex routing of bit lines. Further ports are even more complex and sometimes not even possible in practice due to congestion. The controller may then control individual shifting of the chains based on the accesses or instructions on the multiple memory ports. In addition, it may be possible to read and write a row simultaneously and/or freely combine and read and write combination. The shiftable memory may therefore be configured to shift data in through the serial input data port(s) and shift data out through the serial output data port(s) simultaneously. FIG. 3 shows examples of multiple parallel shifting operations. In FIG. 3A two rows are read and shifted out serially on two serial output ports. In FIG. 3B, two rows are shifted to two read shift registers, which can then be accessed by parallel data ports. FIG. 4 shows a further example of multiple parallel shift operations. The shift of the first row is exploited both by a read and a write operation. The same is valid for the second row. The data of the third row is read. The data of the fourth row is written. The data of the sixth row is read and the data of the last memory cell is shifted back to the first cell, as in a circular shift register. In one embodiment, the controller is further configured to shift data from a last memory cell in a row to a first memory cell in the row. The controller may be configured to perform a shift operation of one or several of the chains of memory cells based on an external command or based on logic values on input ports of the shiftable memory.

The output data logic may be configured for connecting an output of any of the chains of memory cells to a second serial output data port, or at least one second parallel output data port and at least one second read shift register configured for serially collecting serial output data from the output of any of the chains of memory cells. This can be done for several rows, such that n chains of memory cells can be shifted in parallel. Hence, the shiftable memory may comprise at least one second serial output data port, wherein the output data logic is further configured for connecting an output of any of the chains of memory cells to the second serial output data port, or at least one second parallel output data port and at least one second read shift register configured for serially collecting serial output data from the output of any of the chains of memory cells. The controller may accordingly be configured to shift two chains of memory cells in parallel to the first and second serial output data ports, respectively. In one embodiment, the shiftable memory further comprises a configurable number of n serial output data ports, wherein the controller is configured to shift n chains of memory cells in parallel to the n serial output data ports. According to one embodiment, the controller is configured to shift two chains of memory cells in parallel with an arbitrarily configurable delay between the two chains of memory cells. This means that depending on, for example, what the data is used for and when it is needed, it may be useful to shift the chains of memory cells individually.

Since several chains can be shifted, thereby read, in parallel, it may be a further option to add output logic, such as arithmetic logic, connected between the outputs of the chains or the read shift registers and the memory output ports. Preferably, the arithmetic logic is configurable to perform operations on the data that is read. In this manner, the memory can be used, for example, to read several rows in parallel and perform logical operations on the read data during the read operation. The controller may be configured to use the output logic to perform logic operations on the first serial data output, the second serial output data port and optionally the configurable number of n serial output data ports. In one embodiment, the presently disclosed shiftable memory further comprising output logic, such as arithmetic logic, wherein the controller is configured to use the output logic to perform logic operation(s) on the first serial data output and/or the second serial output data port and optionally a configurable number of n serial output data ports. Such operation (s) may be performed based on an external command or based on logic values on input ports of the shiftable memory. The controller may further configurable to connect a result of the logic operation(s) to the at least one first serial input data port and serially shift the result to any of the chains of memory cells. The output logic may comprise several operation units, wherein the output of each operation unit can be connected to memory output ports, to another operation unit or back to the at least one first serial input data port. The presently disclosed shiftable memory may comprise 'logic-in-memory', i.e. reducing energy and latency by integrating logic operations in the memory. The inventors have realized that combining these logic operations with the presently disclosed features related to a shiftable memory, significant advantages can be achieved.

The shiftable memory may further comprise at least one second serial input data port, wherein the input data logic is further configured for connecting the second serial input data port to an input of any of the chains of memory cells, or at least one second parallel input data port and at least one second write shift register for serially shifting input data to the input of any of the chains of memory cells. In this way, a dual-port memory can be implemented. The controller may be configured to shift in data from the first and second serial input data ports in parallel to two of the chains of memory cells in parallel. The concept can be extended to any number of rows/chains. Hence, in one embodiment, the shiftable memory further comprises a configurable number of m serial input data ports, wherein the controller is configured to shift in data from them serial input data ports to m chains of memory cells in parallel.

A reset of the shiftable memory can be done by shifting all rows until all memory cells have been written to a predefined reset value. Such an operation could be initiated either manually by accesses the rows through a write process, preferably by writing all rows in parallel. Alternatively, the memory may have a reset port, which may trigger a reset instruction into an operation of shifting all rows until all memory cells have been written.

The present disclosure relates to a shiftable memory. The shiftable memory may be implemented without bit lines. In other embodiments, bit lines may still be used. In an embodiment without bit lines, the data will have to be shifted in and out serially to/from the chains of memory cells during write and read operations. This means that an operation may take a number of clock cycles, i.e. when data is read, for instance, the process or unit reading from the memory will have to wait for a number of clock cycles until the data is ready on the output port. For some applications this delay may be acceptable. Since the delay, which can be acceptable, will typically vary between applications, the inventors have realized that having an internal faster and configurable clock signal (or enable signal for the shifting processes) may provide a solution that has the power and area efficiency of the shiftable memory but still maintains a suitable access speed for the application. In one embodiment, the shiftable memory comprises an internal dynamically configurable enable signal for shifting data in the chains of memory cells, the internal dynamically configurable enable signal having a configurable frequency. The memory may receive such a signal, such as a clock signal, from a port. The switch logic elements may be controlled by enable signals based on the clock on the port. In one embodiment, the shiftable memory receives a first clock signal or enable signal for shifting data in the chains of memory cells, and the shiftable memory comprises a clock generation unit for generating a second clock signal or enable signal based on the first clock signal.

In one embodiment of the presently disclosed shiftable memory, the controller is further configured to shift data towards the output data port, wherein only data in memory cells that do not have valid data in the next neighboring memory cell towards the output data port are shifted. This is exemplified in FIG. 12. In this embodiment data may be shifted individually one by one. In the example, data 1 is the data closest to the output port. In the first clock cycle, data 1 is shifted out. In the second clock cycle, data 2 is shifted one step towards the output port. In the third clock cycle, both data 2 and data 3 can be shifted since there is one memory cell between data 2 and data 3, which is not occupied, and so forth. In one embodiment, the shiftable memory further comprising separate control signals for each bit within a row.

Figure 10:
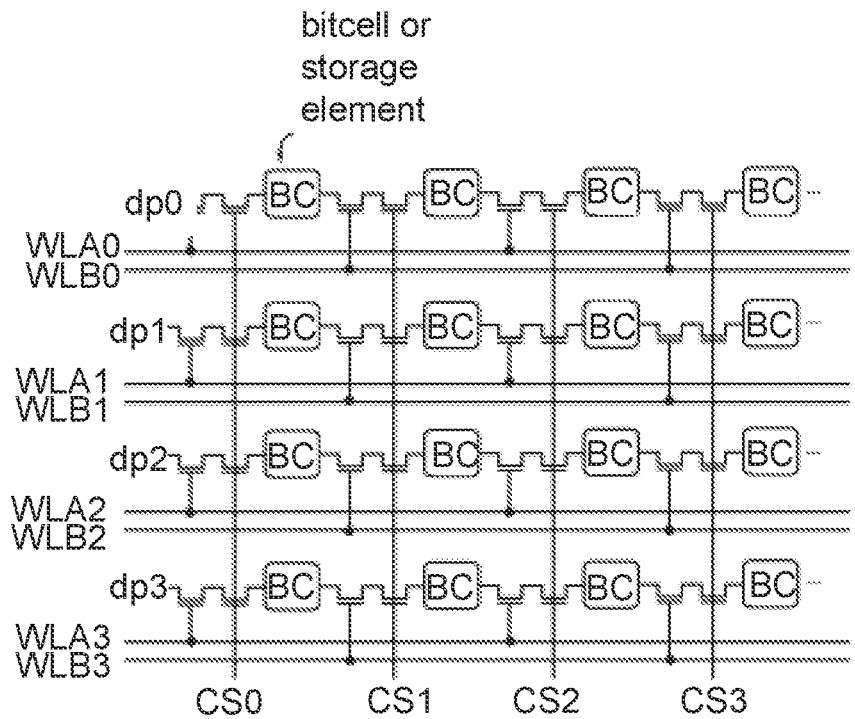
FIG. 10 shows an example of improved configuration of control signals for shifting of data in the shiftable memory.

The interconnections of memory cells within rows can be implemented by means of switch elements. In one embodiment, the memory cells are separated by two serially connected switch elements, such as a first switch element, such as a first transistor, and a second switch element, such as a second transistor, as shown in FIGS. 10 and 11, where 20 and 21 denote the first and second switch elements.

Figure 11:
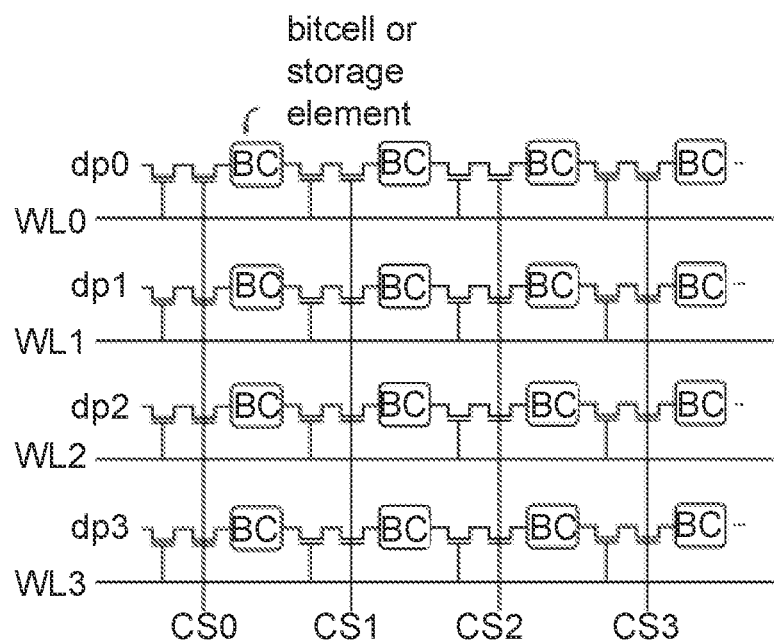
FIG. 11 shows a further example of improved configuration of control signals for shifting of data in the shiftable memory.

Each row may be connected to a word line signal connected to all of the first switch elements of the row, as shown in FIG. 11. Each column may be connected to a selection signal connected to all of the second switch elements of the column, as shown in FIG. 11. Alternatively, each row may connected to at least two word line signals, wherein the at least two word line signals alternating connected to the first switch elements of the row, as shown in FIG. 10. As can be seen, for the first row, there are two word line signals WLA0 and WLB0, wherein WLA0 is connected to the first and third of the first switching elements, and wherein WLB0 is connected to the second and fourth of the first switching elements. Also in this case, each column may be connected to a selection signal connected to all of the second switch elements of the column.

In one embodiment, the rows of the shiftable memory are split into a plurality of sections. Each section may be connected to an input and/or output data port, or to read and/or write shift registers, as described above. By shifting the sections in parallel, read and write operations can be performed faster compared to sequential shifting of the entire row.

The controller of the presently disclosed shiftable memory may be further configured to control supply voltage levels of rows and/or columns and/or for individual memory cells of the shiftable memory. In one embodiment, during a write operation to a memory cell, such as a 6T bit cell, the controller can be configured to reduce the voltage of the entire column to make it easier to write. In one embodiment, during a read operation, the controller may be configured to increase the supply voltage of the bit cell that is read from to make it easier/faster to read. The supply voltage adjustment can be seen as temporarily boosting or lowering row-wise, column-wise or even at individual cell level.

Static Random Access Memory

In one embodiment, the shiftable memory is a static random access memory. The metal-oxide-semiconductor field-effect transistor (MOSFET) has an insulated gate, whose voltage determines the conductivity of the device. This ability to change conductivity with the amount of applied voltage can be used for amplifying or switching electronic signals. In one embodiment of the presently disclosed shiftable memory, the memory cells are implemented using MOSFETs. MOSFET technology is used in digital complementary metal-oxide-semiconductor (CMOS) logic, which uses p- and n-channel MOSFETs as building blocks.

In one embodiment of the presently disclosed shiftable memory, the memory cells are of the five-transistor (5T) or six-transistor (6T) CMOS static random access memory type, preferably without bit line connections and/or without bit line pass gates. In the example, the memory cell comprises:

- a first transistor (M1), a second transistor (M2), a third transistor (M3) and a fourth transistor (M4) forming two cross-coupled inverters defining a first storage node (Q) and an inverted first storage node ($\bar{Q}$);
- a fifth transistor (M5) connected between to inverted first storage node ($\bar{Q}$);
- optionally a sixth transistor (M6) connected to the first storage node (Q);
- a first word line (WL1) connected to the fifth transistor (M5), said first word line (WL1) controlling the access to the first inverted storage node ($\bar{Q}$); and
- optionally a second word line (WL2) connected to the sixth transistor (M6), said second word line (WL2) controlling the access to the first storage node (Q).

Figure 7D:
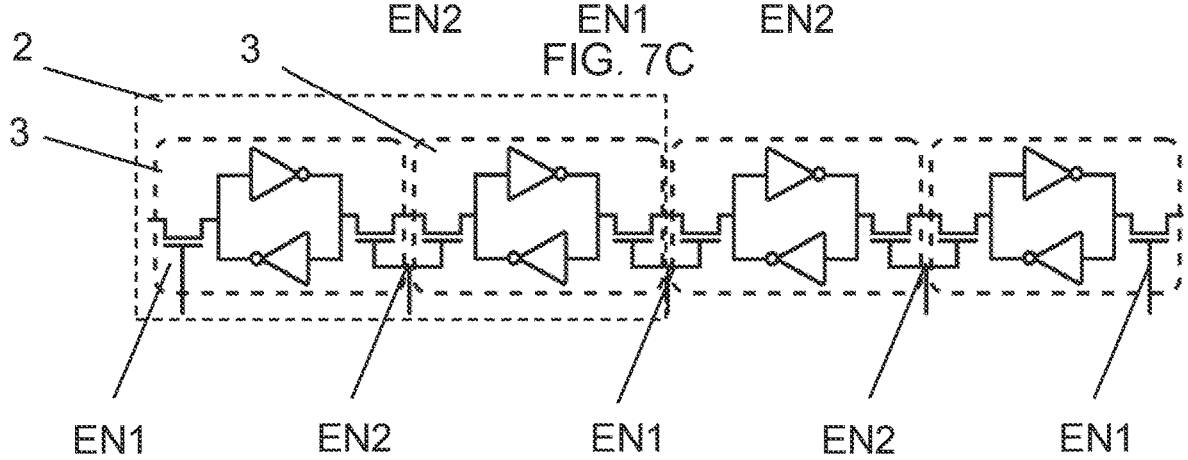
Figure 8:
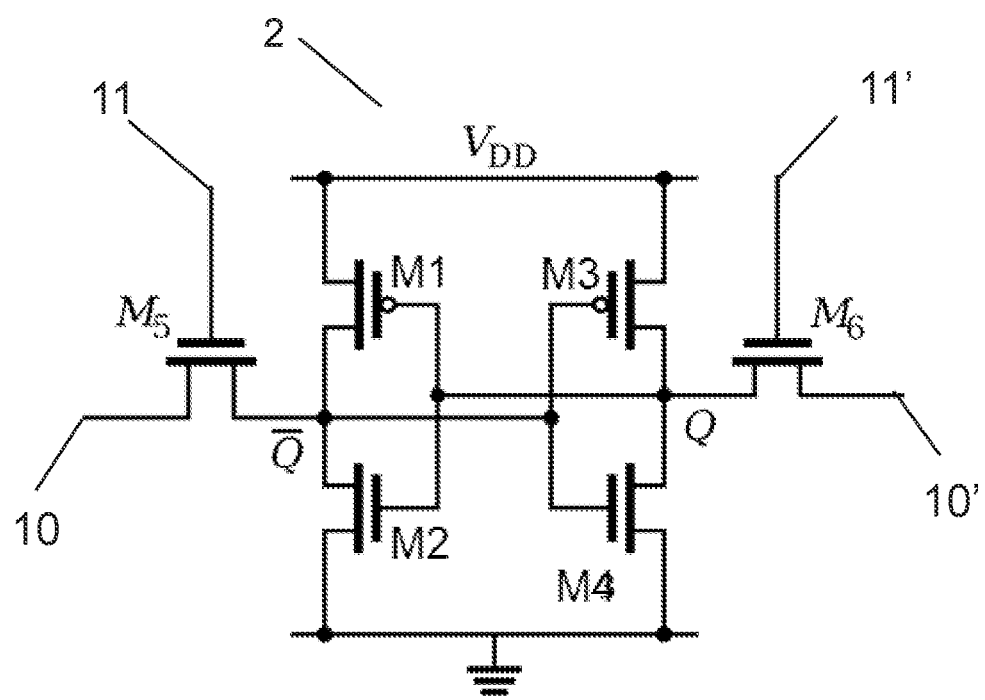
FIG. 8 illustrates an embodiment of a memory cell or memory element of a chain of memory cells of a static random access memory.

FIG. 8 shows an example of a 6T memory cell. In the presently disclosed shiftable memory, instead of connecting the access nodes (10) to bit lines of the memory, the nodes may be connected to a memory cell of a neighboring column. An example of such serial connections is shown in FIG. 7D. The control/shift enable signals for shifting data in the memory cells may be connected to the word lines (11) and/or the supply lines of the memory cells.

The memory cells may also be implemented as In practice a latch (two back to back inverters) and a switch. The memory cells may also be implemented as standard cell based latches and flip-flops.

Dynamic Random Access Memory

Figure 9E:
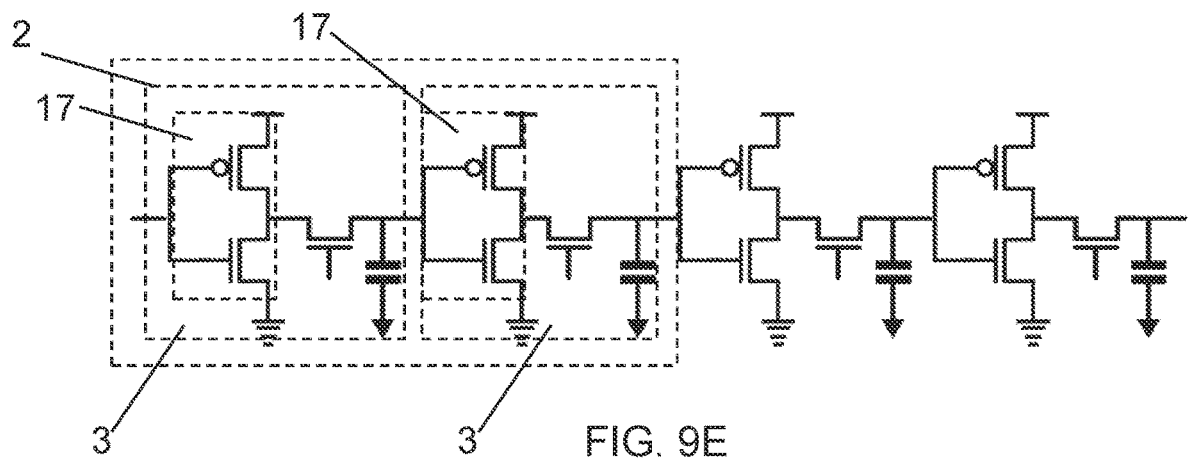

In one embodiment, the shiftable memory is a dynamic random access memory. DRAM stores each bit in a small capacitor, which can either be charged or discharged. An advantage of DRAM is the small size and simplicity of the memory cells. In the DRAM embodiment of the presently disclosed shiftable memory, the memory cells are implemented as data restore and amplification units, such as inverters. FIG. 9E shows an example of how the memory cells can be implemented. The restore and amplification units may be implemented as a pair of complementary transistors, in the example as one NMOS gate and one PMOS gate. Each memory cell may comprise two serially connected memory elements. Alternatively, each memory cell may comprise a single memory element. Each memory element may comprise a data restore and amplification unit and a switch element connected in series, and a capacitor for storing a bit value connected in parallel.

DRAMs are very cheap per bit in terms of power and area compared to SRAMs. One disadvantage of DRAMs, however, is that they have to be periodically refreshed. Conventional DRAMs therefore require an external memory refresh circuit. The inventors have found that the presently disclosed shiftable memory is very useful in an implementation as a dynamic random access memory since all bits can be refreshed by shifting all chains at least one bit. A one-bit shift of all rows has the consequence that all bits are updated. This process can either be triggered by a special refresh instruction, for example by enabling a special refresh port, or by, for example, reading from all rows, either in parallel, one by one, or in groups. In this embodiment each row may be implemented as a circular shift register, wherein the last bit of the row is written to the first bit of the row when the row is shifted so that the data that has been read is maintained in the row after it has been read. In one embodiment, the controller of the shiftable memory is further configured to keep track of the current positions of the bits in the chains of memory cells. The refresh operation of the dynamic random access memory may be performed by shifting each row at least one step. All rows may be shifted simultaneously.

Method of Operating a Shiftable Memory

The present disclosure further relates to a method of operating a shiftable memory, the method comprising the steps of:

shifting data of at least one row of a shiftable memory having a plurality of memory cells arranged in rows and columns, wherein the memory cells of the rows are interconnected, thereby forming chains of memory cells;

reading shifted data sequentially from a first serial output data port of the shiftable memory connected to an output of any of the chains of memory cells, or shifting data sequentially to an internal read shift register and reading data from the internal read shift register through a parallel output data port, or writing data sequentially to a first serial input port of the shiftable memory connected to an input of any of the chains of memory cells, or writing data from a parallel input data port to an internal write shift register and shifting data sequentially from the internal write shift register to an input of any of the chains of memory cells.

As described above, each memory cell may comprise two serially connected memory elements, wherein the shifting of the two serially connected memory elements is controlled using two different control signals, wherein the two different control signals operate in two different phases. Therefore, in one embodiment, the method further comprises the step of shifting at least one row of the shiftable memory by shifting a first memory element of the two memory elements using a first control signal and shifting a second memory element of the two memory elements using a second control signal. The first and second control signals may operate in two different phases. For example, the first and second control signals may be inverted or skewed in relation to each other.

In one embodiment, at least two rows are shifted in parallel. In a dual-port configuration, two rows may, for example, be shifted in parallel to read data from two different ports concurrently in a dual-port memory configuration. Two rows, either the same or other rows, may also be shifted in parallel to write data from two different ports concurrently in a dual-port memory configuration. The method may further comprise the step of shifting n rows in parallel to read data from n different ports concurrently in a multi-port memory configuration, where n is 3 or higher. Alternatively, or in combination, the method further comprises the step of shifting m rows in parallel to write data from m different ports concurrently in a multi-port memory configuration, wherein m is 3 or higher.

The method of operating the shiftable memory may also shift data of the memory cells individually. In one embodiment, data is shifted towards the output data port, wherein only data in memory cells that do not have valid data in the next neighboring memory cell towards the output data port are shifted. This is exemplified in FIG. 12. In this embodiment data may be shifted individually one by one.

The method of operating a shiftable memory may further comprising the step of shifting each row at least one step, thereby performing a refresh operation of the shiftable memory. The step of shifting each row at least one step may be performed in parallel, i.e. shifting all rows at the same time, which can be triggered by a special refresh instruction, for example by enabling a special refresh port, or by for example reading from all rows, while routing the output of the last cell to the input of the first cell. The process can also be performed by shifting rows one by one or in groups.

In one embodiment, the rows of the shiftable memory are split into a plurality of sections. Accordingly, the method of operating a shiftable memory may comprise the step of shifting data in the sections in parallel to input or output data to and/or from the plurality of sections in parallel.

A person skilled in the art will recognize that the method may comprise the step of providing any variant of the shiftable memory as described in the present disclosure.

DETAILED DESCRIPTION OF DRAWINGS

The invention will in the following be described in greater detail with reference to the accompanying drawings. The drawings are exemplary and are intended to illustrate some of the features of the presently disclosed shiftable memory and method of operating a shiftable memory, and are not to be construed as limiting to the presently disclosed invention.

FIG. 1 is a conceptual top-level exemplary illustration of the presently disclosed shiftable memory (1). The shiftable memory (1) has a number of memory cells (2) arranged in rows (4) and columns (12), wherein the memory cells of the rows are interconnected, thereby forming chains of memory cells. The shiftable memory (1) further comprises a controller (5) configured to control the shifting of the data in the chains (4) of memory cells and control output data logic (7) and input data logic (8). The shiftable memory may have a standard interface having for example address and data ports, write enable, read enable, and also a clock signal. The peripheral logic may comprise read and/or write decoders and/or sense amplifiers and/or control and/or timing logic and drivers and further logic. An enable and/or clock generation unit (9) may be configured to generate shift enable signals to the chains.

Figures 2A, 2B:
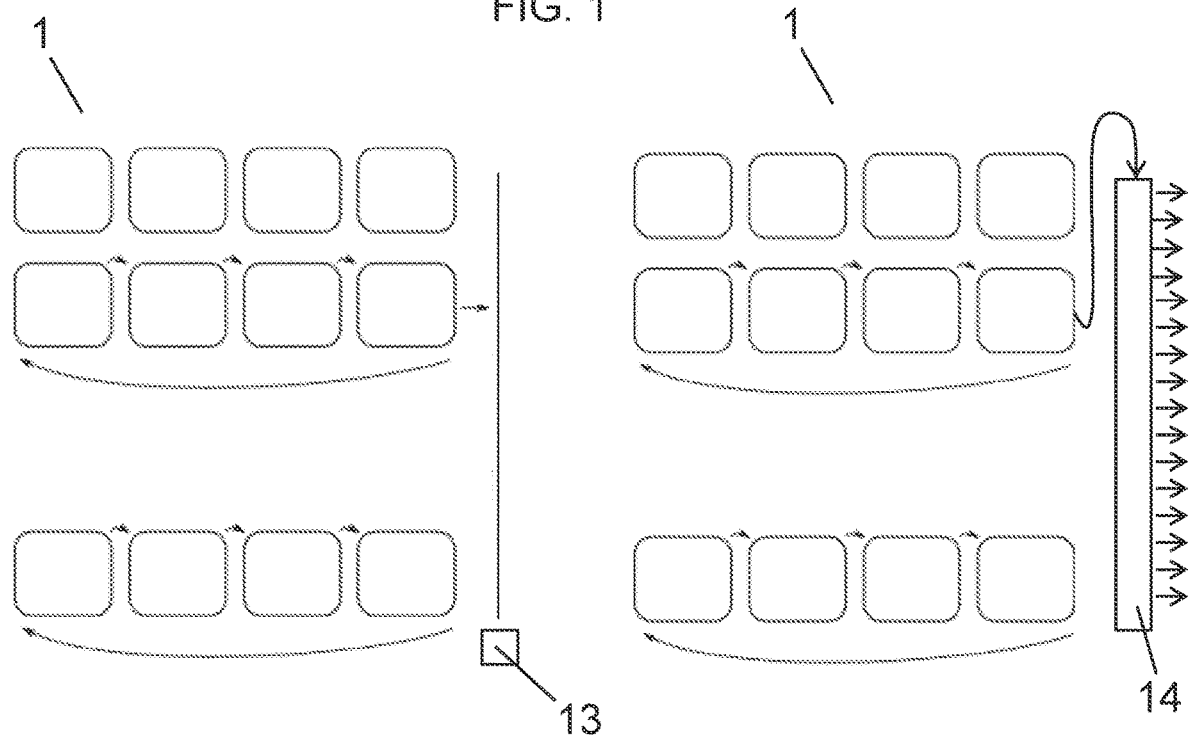
FIG. 2 show examples of shift and read operations of the presently disclosed shiftable memory.

FIG. 2 show examples of shift and read operations of the presently disclosed shiftable memory (1). In FIG. 2A, the data that is shifted out from row 2 is shifted serially to a data output port (13). In FIG. 2B, the data that is shifted out from row 2 is shifted to an internal read shift register (14), from which it can be read by a parallel data port.

FIG. 3 show examples of shift and read operations of the presently disclosed shiftable memory (1) for two read ports. In FIG. 3A, data is shifted in two rows in parallel. Data is shifted out serially to two data output ports (13). In FIG. 3B, the data that is shifted out from the rows are shifted to two internal read shift registers (14), from which it can be read by parallel data ports.

FIG. 4 shows an example of multiple parallel shifting operations. First data is read and written to/from a first row (4a). Second data is read and written to/from a second row (4b). Third data is read from a third row (4a). The shifting of the data of the third row (4c) is arranged such that data from the last cell is routed back to the first cell of the chain, as in a circular shift register. Fourth data is written to a fourth row (4d). Fifth data is read from a fifth row (4f). The shifting of the data of the fifth row (4f) is arranged such that data from the last cell is routed back to the first cell of the chain, as in a circular shift register.

Figure 6:
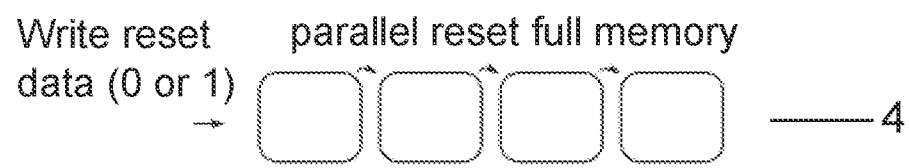
FIG. 6 shows an example of a reset operation.

FIG. 6 shows an example of a reset operation of a row (4). By shifting ones '1' or zeroes ('0') the row can be reset. By shifting all rows in parallel in this way, the whole memory can be reset.

FIG. 7 illustrates embodiments of a chain of memory cells of a static random access memory. FIG. 7A shows a chain of memory cells separated by shift logic elements (15) in the form of switches (15). FIG. 7B shows how the switches may be controlled by two different control signals (SHIFT EN1 and EN2). FIG. 7C shows an example in which the memory cells are implemented as cross-coupled inverters (16). In FIG. 7D each memory cell (2) is implemented as two serially connected memory elements (3). The data is shifted in two steps, wherein a first enable signal (EN1) controls the shifting of the first memory element and a second enable signal (EN2) controls the shifting of the second memory element. Each memory cell may. The memory elements may be implemented as, for example, 5T or 6T memory cells. In the example of FIG. 7D, the memory elements are implemented as 6T memory cells.

FIG. 8 shows an embodiment of a memory cell (2) or memory element (3) of a chain of memory cells of a static random access memory. The memory cell comprises: a first transistor (M1), a second transistor (M2), a third transistor (M3) and a fourth transistor (M4) forming two cross-coupled inverters defining a first storage node (Q) and an inverted first storage node ($\overline{Q}$). The memory cell further comprises a fifth transistor (M5) connected to the inverted first storage node ($\overline{Q}$); a sixth transistor (M6) connected to the first storage node (Q); a first word line (WL1, 11) connected to the fifth transistor (M5), said first word line (WL1) controlling the access to the first inverted storage node ($\overline{Q}$); and a second word line (WL2, 11') connected to the sixth transistor (M6), said second word line (WL2) controlling the access to the first storage node (Q). Access nodes (10, 10') can be serially connected to corresponding access nodes of a neighboring memory cell. This can be implemented, for example, by connecting the fifth transistor (M5) of one cell to the fifth transistor (M5) of a neighboring cell, and connecting the sixth transistor (M6) of one cell to the sixth transistor (M6) of a neighboring cell. The chains may thereby be formed by sequences . . . M5-M5-(M1/M2/M3/M4 inverters)-M6-M6-(M1/M2/M3/M4 inverters)-M5-M5 etc. The fifth and sixth transistors (M5, M6) can be the switch logic elements of the chains.

FIG. 9 illustrates embodiments of a chain of memory cells of a dynamic random access memory. FIG. 9A shows a chain of memory cells (2) separated by shift logic elements (15) in the form of switches (15). FIG. 9B shows how the switches may be controlled by two different control signals (SHIFT EN1 and EN2). FIG. 9C shows an example in which the memory cells are implemented as restore and amplification units (17). In FIG. 9D each memory cell (2) is implemented as a restore and amplification unit (17) with a capacitor (19) for storing a bit value and a switch element (18) in the form of a transistor arranged between the restore and amplification unit (17) and capacitor (19). The data is shifted in two steps, wherein a first enable signal (EN1) controls the shifting of the first memory element and a second enable signal (EN2) controls the shifting of the second memory element. FIG. 9E shows an example of how the memory cells (2) can be implemented. The restore and amplification units (17) are implemented as pairs of complementary transistors, in the example as one NMOS gate and one PMOS gate. Each memory cell (2) comprises two serially connected memory elements (3).

FIG. 10 shows an example of improved configuration of control signals for shifting of data in the shiftable memory. There is a first switching element 20 and a second switching element 21 between each memory cell. For the first row, there are two word line signals WLA0 and WLB0, wherein WLA0 is connected to the first and third of the first switching elements, and wherein WLB0 is connected to the second and fourth of the first switching elements. For the second row, there are two word line signals WLA1 and WLB1, wherein WLA1 is connected to the first and third of the first switching elements of the second row, and wherein WLB1 is connected to the second and fourth of the first switching elements of the second row. The third and fourth rows are controlled in the same way using WLA2 and WLB2 and WLA3 and WLB3, respectively. In this example, each column is connected to a selection signal (CS0, CS1, CS2, CS3) connected to all of the second switch elements (21) of the column.

FIG. 11 shows a further example of improved configuration of control signals for shifting of data in the shiftable memory. There is a first switching element 20 and a second switching element 21 between each memory cell. For each row there is a word line signal connected to all of the first switch elements (20) of the row. For the first row there is a word line signal WL0 connected to all of the first switch elements (20) of the first row. For the second row there is a word line signal WL1 connected to all of the first switch elements (20) of the second row, and so forth. Each column is connected to a selection signal (CS0, CS1, CS2, CS3) connected to all of the second switch elements (21) of the column.

Figure 12:
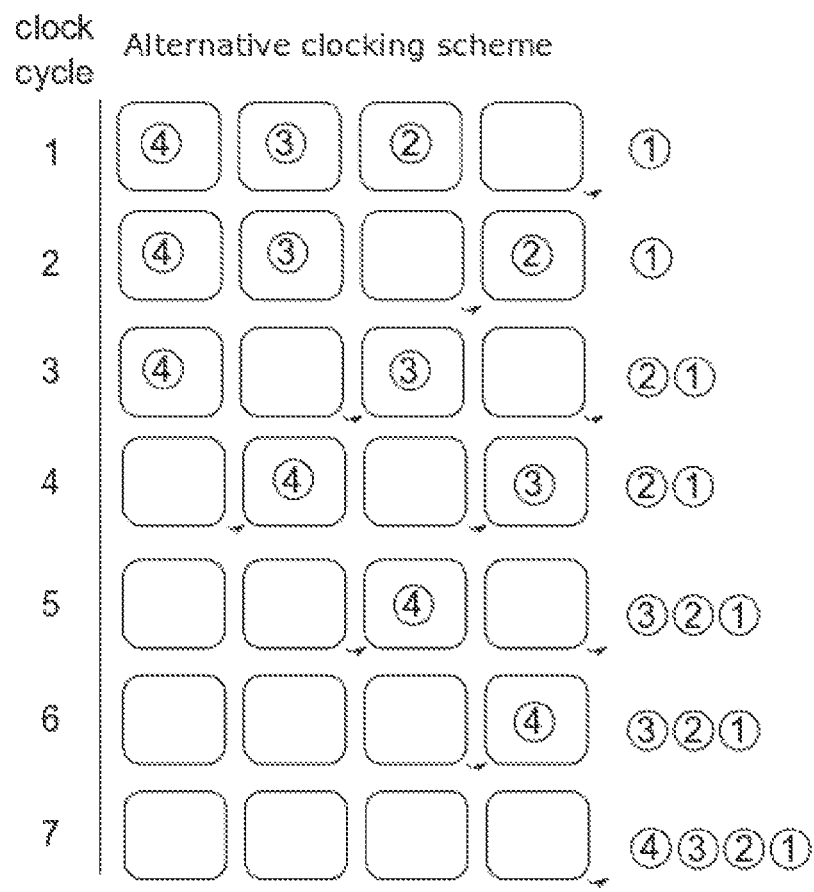
FIG. 12 shows an example of a clocking scheme for the presently disclosed shiftable memory, wherein data is individually shifted.

FIG. 12 shows an example of a clocking scheme for the presently disclosed shiftable memory, wherein data is individually shifted. In the example, data 1 is the data closest to the output port. In the first clock cycle, data 1 is shifted out. In the second clock cycle, data 2 is shifted one step towards the output port. In the third clock cycle, both data 2 and data 3 can be shifted since there is one memory cell between data 2 and data 3, which is not occupied. In the fourth clock cycle, data 3 and and data 4 are shifted. In the fifth and sixth clock cycles, data 4 is shifted.

Figure 13:
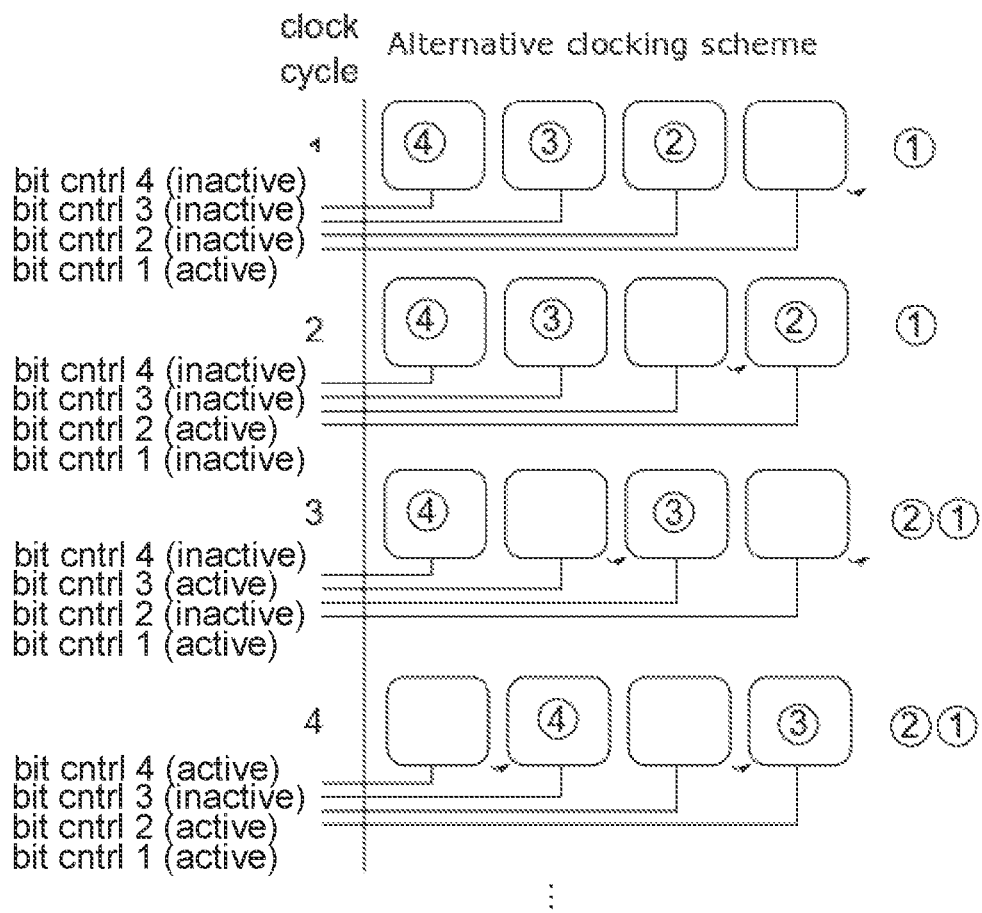
FIG. 13 shows an example of separate control signals for each memory cell within a row.

FIG. 13 shows an example of separate control signals (bit cntrl 1, bit cntrl 2, bit cntrl 3 and bit cntrl 4) for each memory cell within a row. The drawing illustrates how the controls signal may be active during the first four clock cycles for individual shifting of the data.

Figure 14:
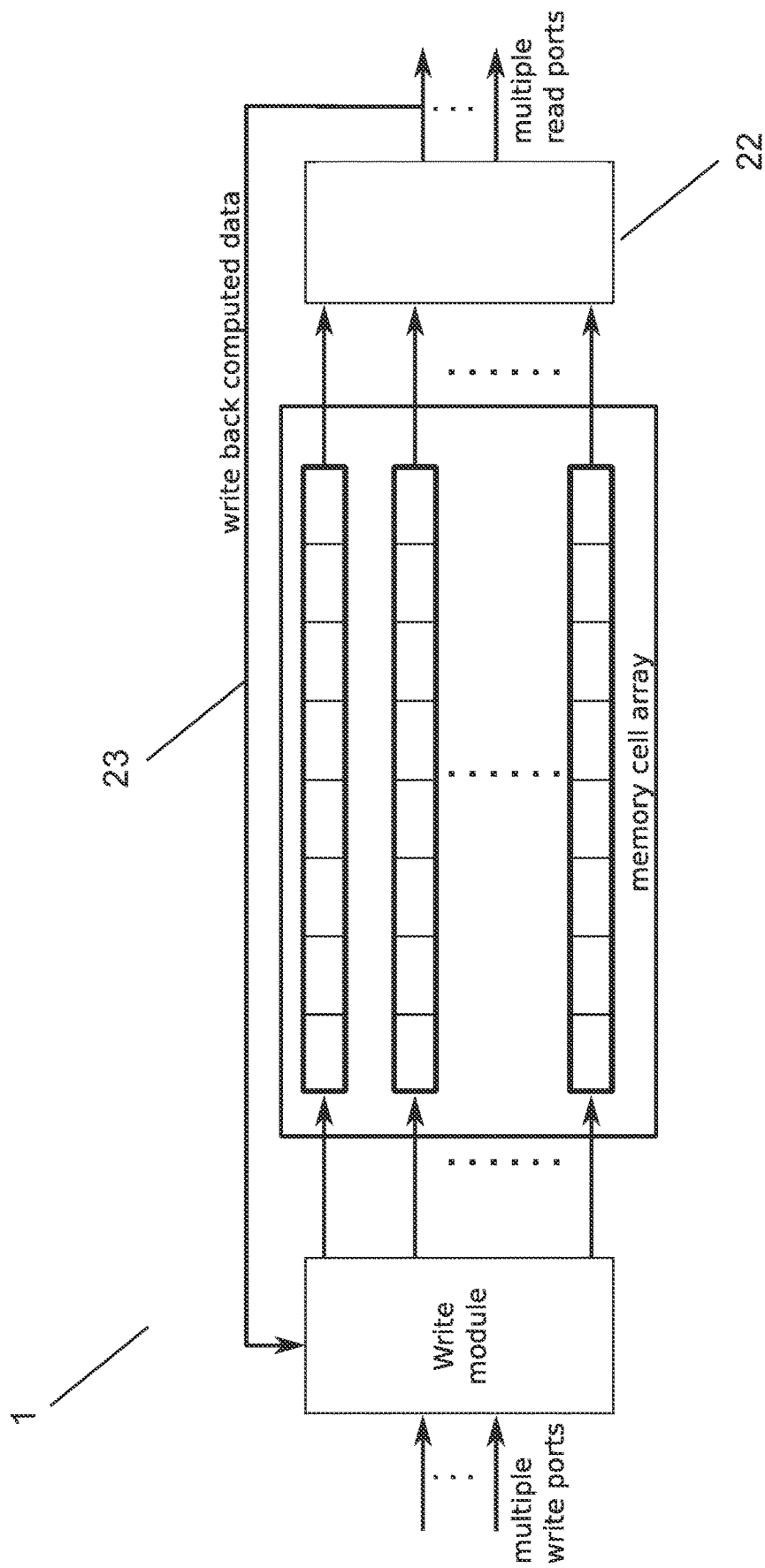
FIG. 14 shows an example of the presently disclosed shiftable memory having output logic, such as arithmetic logic, to perform logic operations on data shifted out from the chains of memory cells.

FIG. 14 shows an example of the presently disclosed shiftable memory (1) having output logic (22), such as arithmetic logic, to perform logic operations on data shifted out from the chains of memory cells. The memory preferably comprises the output data logic for connecting an output of any of the chains of memory cells to the first serial output data port, or at least one first parallel output data port and at least one read shift register configured for serially collecting serial output data from the output of any of the chains of memory cells. The output can then be used to perform logical/arithmetic operations. The result of such operation could then either be sent out via a memory read port or written back (23) to the memory (1). If there is no logic/arithmetic operation, the read data can bypass the output logic (22).

Figure 15:
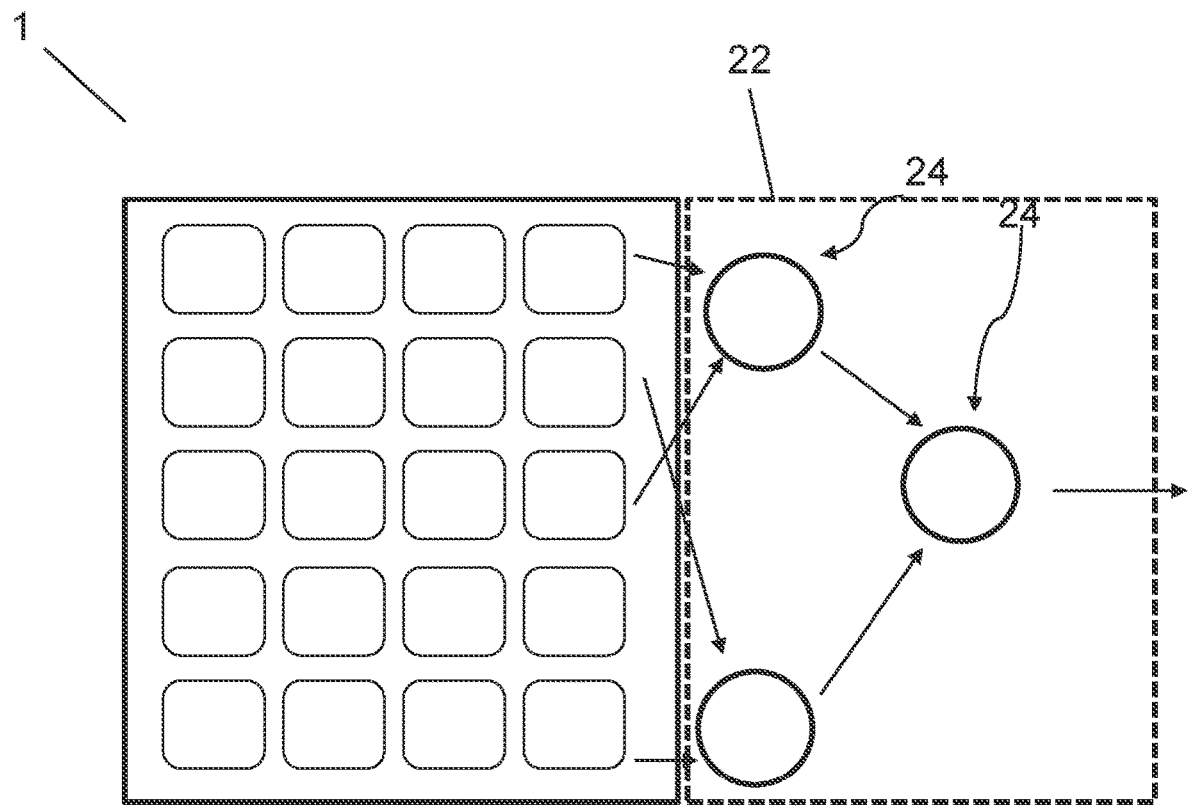
FIG. 15 shows an example of the presently disclosed shiftable memory having output logic comprising a plurality of operation units.

FIG. 15 shows an example of the presently disclosed shiftable memory (1) having output logic (22) comprising a plurality of operation units (24). The output of each operation unit (24) can be connected to memory output ports, to another operation unit (24) or back to the at least one first serial input data port.

FURTHER DETAILS OF THE INVENTION

1. A shiftable memory comprising:
   a plurality of memory cells arranged in rows and columns, wherein the memory cells of the rows are interconnected, thereby forming chains of memory cells;
   at least one first serial output data port; output data logic for connecting an output of any of the chains of memory cells to the first serial output data port, or at least one first parallel output data port and at least one read shift register configured for serially collecting serial output data from the output of any of the chains of memory cells; and/or
   at least one first serial input data port; input data logic for connecting the first serial input data port to an input of any of the chains of memory cells, or at least one parallel input data port and at least one write shift register for serially shifting input data to the input of any of the chains of memory cells; and
   a controller configured to control the shifting of the data in the chains of memory cells, the controller further configured to control the output data logic and/or the input data logic.
2. The shiftable memory according to item 1, wherein the shiftable memory is operational without bit lines interconnecting the memory cells within the columns.
3. The shiftable memory according to any of the preceding items, wherein one of the input data port and output data port is a parallel port.
4. The shiftable memory according to any of the preceding items, wherein the memory cells of the rows are separated by shift logic elements, such as switch elements and/or gate elements and/or transistors.
5. The shiftable memory according to any of the preceding items, wherein each memory cell comprises two serially connected memory elements, such as bit cells.
6. The shiftable memory according to item 5, wherein shifting of the two serially connected memory elements is controlled using two different control signals, wherein the two different control signals operate in two different phases.
7. The shiftable memory according to item 6, wherein the control signals are clock signals and/or wherein the two control signals are inverted or skewed in relation to each other.
8. The shiftable memory according to any of items 6-7, wherein the control signals control the shift logic elements.
9. The shiftable memory according to any of the preceding items, wherein the memory cells are made of MOSFETs.
10. The shiftable memory according to any of the preceding items, wherein the memory cells are of the five-transistor (5T) or six-transistor (6T) CMOS static random access memory type, without bit line connections and/or without bit line pass gates.
11. The shiftable memory according to item 10, wherein each memory cell comprises:
   a first transistor (M1), a second transistor (M2), a third transistor (M3) and a fourth transistor (M4) forming two cross-coupled inverters defining a first storage node (Q) and an inverted first storage node ($\overline{Q}$);
   a fifth transistor (M5) connected to the inverted first storage node ($\overline{Q}$);
   optionally a sixth transistor (M6) connected to the first storage node (Q);

a first word line (WL1) connected to the fifth transistor (M5), said first word line (WL1) controlling the access to the first inverted storage node ($\overline{Q}$); and optionally a second word line (WL2) connected to the sixth transistor (M6), said second word line (WL2) controlling the access to the first storage node (Q).

12. The shiftable memory according to item 6 and item 11, wherein the control signals are connected to the word lines or control lines of the memory cells.

13. The shiftable memory according to any of the preceding items, wherein the memory cells are implemented as data restore and amplification units, such as inverters.

14. The shiftable memory according to item 13, wherein the restore and amplification units are implemented as a pair of complementary transistors.

15. The shiftable memory according to any of items 13-14, wherein each memory cell comprises a data restore and amplification unit and a switch element connected in series, and a capacitor for storing a bit value connected in parallel.

16. The shiftable memory according to any of the preceding items, wherein the outputs of the chains of memory cells are connectable to the first serial output data port through one or more multiplexer(s).

17. The shiftable memory according to any of the preceding items, further comprising at least one second serial output data port, wherein the output data logic is further configured for connecting an output of any of the chains of memory cells to the second serial output data port, or at least one second parallel output data port and at least one second read shift register configured for serially collecting serial output data from the output of any of the chains of memory cells.

18. The shiftable memory according to item 17, wherein the controller is configured to shift two chains of memory cells in parallel to the first and second serial output data ports, respectively.

19. The shiftable memory according to any of the preceding items, wherein the controller is further configured to shift data towards the output data port, wherein only data in memory cells that do not have valid data in the next neighboring memory cell towards the output data port are shifted.

20. The shiftable memory according to item 19, further comprising separate control signals for each bit within a row.

21. The shiftable memory according to any of the preceding items, wherein the memory cells are separated by two serially connected switch elements, such as a first switch element, such as a first transistor, and a second switch element, such as a second transistor.

22. The shiftable memory according to any of the preceding items, wherein each row is connected to a word line signal connected to all of the first switch elements of the row, and wherein each column is connected to a selection signal connected to all of the second switch elements of the column.

23. The shiftable memory according to any items 1-21, wherein each row is connected to at least two word line signals, wherein the at least two word line signals alternating connected to the first switch elements of the row, and wherein each column is connected to a selection signal connected to all of the second switch elements of the column.

24. The shiftable memory according to any of the preceding items, wherein the controller is further configured to control supply voltage levels of rows and/or columns and/or for individual memory cells of the shiftable memory.

25. The shiftable memory according to any of the preceding items, further comprising a configurable number of n serial output data ports, wherein the controller is configured to shift n chains of memory cells in parallel to the n serial output data ports.

26. The shiftable memory according to any of items 18-25, further comprising output logic, wherein the controller is configured to use the output logic to perform logic operations on the first serial data output, the second serial output data port and optionally the configurable number of n serial output data ports.

27. The shiftable memory according to item 26, wherein the controller is configured to perform an operation based on an external command or based on logic values on input ports of the shiftable memory.

28. The shiftable memory according to any of the preceding items, further comprising at least one second serial input data port, wherein the input data logic is further configured for connecting the second serial input data port to an input of any of the chains of memory cells, or at least one second parallel input data port and at least one second write shift register for serially shifting input data to the input of any of the chains of memory cells.

29. The shiftable memory according to item 28, wherein the controller is configured to shift in data from the first and second serial input data ports in parallel to two of the chains of memory cells in parallel.

30. The shiftable memory according to any of the preceding items, further comprising a configurable number of m serial input data ports, wherein the controller is configured to shift in data from the m serial input data ports to m chains of memory cells in parallel.

31. The shiftable memory according to any of the preceding items, the memory being configured to shift data in through the serial input data port(s) and shift data out through the serial output data port(s) simultaneously.

32. The shiftable memory according to any of the preceding items, wherein the controller is configured to shift multiple rows in parallel.

33. The shiftable memory according to any of the preceding items, wherein the shiftable memory receives a first clock signal or enable signal for shifting data in the chains of memory cells, and wherein the shiftable memory comprises a clock generation unit for generating a second clock signal or enable signal based on the first clock signal.

34. The shiftable memory according to any of the preceding items, wherein the shiftable memory comprises an internal dynamically configurable enable signal for shifting data in the chains of memory cells, the internal dynamically configurable enable signal having a configurable frequency.

35. The shiftable memory according to any of the preceding items, wherein the controller is further configured to shift data from a last memory cell in a row to a first memory cell in the row.

36. The shiftable memory according to any of the preceding items, wherein the shifting of the data in the chains of memory cells is based on decoded logic values of input ports of the shiftable memory.

37. The shiftable memory according to any of the preceding items, the shiftable memory configured to decode a reset instruction into an operation of shifting all rows until all memory cells have been written.

38. The shiftable memory according to any of the preceding items, wherein the shiftable memory is a static random access memory.

39. The shiftable memory according to any of the preceding items, wherein the shiftable memory is a dynamic random access memory.

40. The shiftable memory according to item 39, wherein a refresh operation of the dynamic random access memory is performed by shifting each row at least one step.

41. The shiftable memory according to any of the preceding items, wherein the row(s) is/are split into a plurality of sections and wherein input data ports and/or output data ports are connectable to each section.

42. A method of operating a shiftable memory, the method comprising the steps of:

shifting data of at least one row of a shiftable memory having a plurality of memory cells arranged in rows and columns, wherein the memory cells of the rows are interconnected, thereby forming chains of memory cells;

reading shifted data sequentially from a first serial output data port of the shiftable memory connected to an output of any of the chains of memory cells, or shifting data sequentially to an internal read shift register and reading data from the internal read shift register through a parallel output data port, or writing data sequentially to a first serial input port of the shiftable memory connected to an input of any of the chains of memory cells, or writing data from a parallel input data port to an internal write shift register and shifting data sequentially from the internal write shift register to an input of any of the chains of memory cells.

43. The method of operating a shiftable memory according to item 42, wherein at least two rows are shifted in parallel.

44. The method of operating a shiftable memory according to any of items 42-43, wherein two rows are shifted in parallel to read data from two different ports concurrently in a dual-port memory configuration.

45. The method of operating a shiftable memory according to any of items 42-44, wherein two rows are shifted in parallel to write data from two different ports concurrently in a dual-port memory configuration.

46. The method of operating a shiftable memory according to any of items 42-45, wherein n rows are shifted in parallel to read data from n different ports concurrently in a multi-port memory configuration.

47. The method of operating a shiftable memory according to any of items 42-46, wherein m rows are shifted in parallel to write data from m different ports concurrently in a multi-port memory configuration.

48. The method of operating a shiftable memory according to any of items 42-47, wherein each memory cell comprises two serially connected memory elements, such as bit cells, and wherein a first of the two memory elements is shifted using a first control signal and a second of the two memory elements is shifted using a second control signal.

49. The method of operating a shiftable memory according to item 43, wherein the first and second control signals operate in two different phases, and/or wherein the first and second control signals are inverted or skewed in relation to each other.

50. The method of operating a shiftable memory according to any of items 42-49, further comprising the step of shifting each row at least one step, thereby performing a refresh operation of the shiftable memory.

51. The method of operating a shiftable memory according to any of items 42-50, wherein the shiftable memory is a memory according to any of items 1-40.

52. The method of operating a shiftable memory according to any of items 42-51, wherein the row(s) is/are split into a plurality of sections and wherein the data in the sections are shifted in parallel to input or output data to and/or from the plurality of sections in parallel.

The invention claimed is:

1. A shiftable memory comprising:
a plurality of memory cells arranged in rows and columns, wherein the memory cells of the rows are interconnected, thereby forming chains of memory cells;
at least one first serial output data port; output data logic for connecting an output of any of the chains of memory cells to the first serial output data port, or at least one first parallel output data port and at least one read shift register configured for serially collecting serial output data from the output of any of the chains of memory cells; and/or
at least one first serial input data port; input data logic for connecting the first serial input data port to an input of any of the chains of memory cells, or at least one parallel input data port and at least one write shift register for serially shifting input data to the input of any of the chains of memory cells; and
a controller configured to control the shifting of the data in the chains of memory cells, the controller further configured to control the output data logic and/or the input data logic;
wherein the shiftable memory is operational without bit lines interconnecting the memory cells within the column.

2. The shiftable memory according to claim 1, wherein each memory cell comprises two serially connected memory elements, such as bit cells.

3. The shiftable memory according to claim 1, wherein shifting of the two serially connected memory elements is controlled using two different control signals, wherein the two different control signals operate in two different phases.

4. The shiftable memory according to claim 1, further comprising at least one second serial output data port, wherein the output data logic is further configured for connecting an output of any of the chains of memory cells to the second serial output data port, or at least one second parallel output data port and at least one second read shift register configured for serially collecting serial output data from the output of any of the chains of memory cells.

5. The shiftable memory according to claim 4, wherein the controller is configured to shift two chains of memory cells in parallel to the first and second serial output data ports, respectively.

6. The shiftable memory according to claim 4, wherein the controller is configured to shift two chains of memory cells in parallel with an arbitrarily configurable delay between the two chains of memory cells.

7. The shiftable memory according to claim 4, further comprising output logic, such as arithmetic logic, wherein the controller is configured to use the output logic to perform logic operation(s) on the first serial data output and/or the second serial output data port and optionally a configurable number of n serial output data ports.

8. The shiftable memory according to claim 7, wherein the controller is configured to perform an operation based on an external command or based on logic values on input ports of the shiftable; memory.

9. The shiftable memory according to claim 7, wherein the controller is further configurable to connect a result of the logic operation(s) to the at least one first serial input data port and serially shift the result to any of the chains of memory cells.

10. The shiftable memory according to claim 1, wherein the controller is further configured to shift data towards the output data port, wherein only data in memory cells that do not have valid data in the next neighboring memory cell towards the output data port are shifted, the memory further comprising separate control signals for each bit within a row.

11. The shiftable memory according to claim 1, wherein all of the memory cells are separated by two serially connected switch elements comprising a first switch element and a second switch element.

12. The shiftable memory according to claim 11, wherein each row is connected to a word line signal connected to all of the first switch elements of the row, and wherein each column is connected to a selection signal connected to all of the second switch elements of the column.

13. The shiftable memory according to claim 1, the memory being configured to shift data in through the serial input data port(s) and shift data out through the serial output data port(s) simultaneously.

14. The shiftable memory according to claim 1, wherein the controller is configured to shift multiple rows in parallel.

15. The shiftable memory according to claim 1, wherein the shiftable memory comprises an internal dynamically configurable enable signal for shifting data in the chains of memory cells, the internal dynamically configurable enable signal having a configurable frequency.

16. The shiftable memory according to claim 1, the shiftable memory configured to decode a reset instruction into an operation of shifting all rows until all memory cells have been written.

17. The shiftable memory according to claim 1, wherein the shiftable memory is a dynamic random access memory, wherein a refresh operation of the dynamic random access memory is performed by shifting each row at least one step.

18. The shiftable memory according to claim 17, wherein the controller is configured to perform the refresh operation and reading and/or writing data from/to the chains of memory cells concurrently.

19. A method of operating a shiftable memory, the method comprising the steps of:

providing a shiftable memory comprising:
    a plurality of memory cells arranged in rows and columns wherein the memory cells of the rows are interconnected, thereby forming chains of memory cells;
    at least one first serial output data port; output data logic for connecting an output of any of the chains of memory cells to the first serial output data port, or at least one first parallel output data port and at least one read shift register configured for serially collecting serial output data from the output of any of the chains of memory cells; and/or
    at least one first serial input data port; input data logic for connecting the first serial input data port to an input of any of the chains of memory cells or at least one parallel, input data port and at least one write shift register for serially shifting input data to the input of any of the chains of memory cells; and
    a controller configured to control the shifting of the data in the chains of memory cells, the controller further configured to control the output data logic and/or the input data logic;
    wherein the shiftable memory is operational without bit lines interconnecting the memory cells within the columns;
shifting data of at least one row of the shiftable memory; and
reading shifted data sequentially from a first serial output data port of the shiftable memory connected to an output of any of the chains of memory cells, or shifting data sequentially to an internal read shift register and reading data from the internal read shift register through a parallel output data port, or writing data sequentially to a first serial input port of the shiftable memory connected to an input of any of the chains of memory cells, or writing data from a parallel input data port to an internal write shift register and shifting data sequentially from the internal write shift register to an input of any of the chains of memory cells.

\* \* \* \* \*